(12) United States Patent
Han

(10) Patent No.: US 7,656,214 B1
(45) Date of Patent: Feb. 2, 2010

(54) SPREAD-SPECTRUM CLOCK GENERATOR

(75) Inventor: Song-Rong Han, Taipei County (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 12/273,245

(22) Filed: Nov. 18, 2008

(51) Int. Cl.
*H03K 3/00* (2006.01)

(52) U.S. Cl. ................................. 327/291; 327/298

(58) Field of Classification Search ............... None
See application file for complete search history.

(56) References Cited

U.S. PATENT DOCUMENTS

| | | | | |
|---|---|---|---|---|
| 5,631,920 | A * | 5/1997 | Hardin | 375/130 |
| 6,249,249 | B1 * | 6/2001 | Obayashi et al. | 342/371 |
| 6,600,771 | B1 * | 7/2003 | Moon et al. | 375/130 |
| 7,061,293 | B2 * | 6/2006 | Fukushima | 327/291 |
| 7,236,028 | B1 * | 6/2007 | Choi | 327/158 |
| 7,400,696 | B2 * | 7/2008 | Chen et al. | 375/376 |
| 2004/0085108 | A1 * | 5/2004 | Murata et al. | 327/158 |

OTHER PUBLICATIONS

Jonghoon Kim et al., "Spread Spectrum Clock Generator With Delay Cell Array to Reduce Electromagnetic Interference," IEEE Transactions on Electromagnetic Compatibility, Vol. 47, No. 4, Nov., 2005, pp. 908-920.

* cited by examiner

*Primary Examiner*—Cassandra Cox
(74) *Attorney, Agent, or Firm*—Winston Hsu

(57) ABSTRACT

A spread-spectrum clock generator is provided, which includes a modulation module and a voltage-controlled delay line (VCDL). The modulation module provides a control voltage. The VCDL is coupled to the modulation module and is configured for modulating the frequency of an input clock signal according to the control voltage, so as to output an output clock signal. The modulation profile of the output clock signal is a periodic function of time.

11 Claims, 11 Drawing Sheets

SPREAD-SPECTRUM CLOCK GENERATOR

BACKGROUND OF THE INVENTION

1. Field of the Invention

The present invention relates to a spread-spectrum clock generator (SSCG). More particularly, the present invention relates to an SSCG including a voltage-controlled delay line (VCDL).

2. Description of Related Art

Spread-spectrum is a technique for modulating a clock frequency. Frequency of a general non-spread-spectrum clock signal is fixed. Energy of such clock signal is concentrated at a signal spectrum tone, and an electromagnetic interference (EMI) thereof is relatively severe. As to a spread-spectrum clock signal, the energy thereof is dispersed to a plurality of spectrum tones, so that amplitude of each tone is decreased, and the EMI is reduced. FIG. 1A and FIG. 1B illustrate two conventional spread-spectrum methods. FIG. 1A illustrates a down spread method, i.e. spreading towards low spectrums, wherein an original clock signal spectrum is marked as 102, and a spread clock signal spectrum is marked as 101. FIG. 1B illustrates a center spread method, i.e. spreading towards high spectrums and low spectrums simultaneously, wherein an original clock signal spectrum is marked as 104, and a spread clock signal spectrum is marked as 103.

FIG. 2 is a schematic diagram illustrating a typical clock frequency modulation profile, and the modulation profile refers to a variation relation between frequencies of a spread spectrum clock signal and time. The spread spectrum has two main parameters, and a first one is modulation percentage, i.e. a proportion between a maximum frequency variation and an original clock frequency. The profile of FIG. 2 belongs to the center spread, the original clock frequency before spreading is $F_{center}$, and the modulation percentage is $(F_{max}-F_{center})/F_{center}$ or $(F_{center}-F_{min})/F_{center}$. A second main parameter is modulation frequency (MF), i.e. a reciprocal of a cycle of the modulation profile, for example, the modulation frequency of the profile of FIG. 2 is $F_{MOD}$.

FIG. 3 is a schematic diagram illustrating a plurality of conventional clock frequency modulation profiles and corresponding output spectrums. FIG. 3 can be regarded as a 3×2 table, wherein a first column illustrates three conventional modulation profiles including a sine wave, a triangle wave and a Hershey's Kiss, and a second column illustrates spectrums of the clock signal after being spread by the left-side modulation profiles. As shown in FIG. 3, the Hershey's kiss is the optimal modulation profile, and amplitude of the output spectrum thereof is the most uniform and lowest, and the EMI thereof is the most minor.

FIG. 4 is a circuit schematic diagram illustrating a conventional SSCG 400 formed based on a phase-locked loop (PLL). Frequency dividers 401 and 402, a phase/frequency detector 403, a charge pump 404, and a voltage control oscillator (VCO) 405 form the main PLL. A low-pass filter formed by a resistor R1 and capacitors C1 and C2 can moderate outputs of the charge pump 404, so that frequency variation of an output clock signal Fout can be stable. A node 406 receives a triangle wave which controls spectrum spreading of the output clock signal Fout.

Within such an SSCG, a loop bandwidth of the PLL is relatively low, and a loop filter thereof has to be designed rather large, so that the capacitors C1 and C2 may occupy a relatively large area, and the capacitor area is generally one to three times greater than other circuits. Due to the two bulk capacitors, looping time of the PLL is greatly prolonged, which can be 20 times greater than that of a general PLL. Therefore, not only the whole area and cost are increased, but also performance thereof is poor.

FIG. 5 is a circuit schematic diagram illustrating another conventional SSCG 500. The SSCG 500 does not apply the analog PLL structure, but applies a digital serial delay structure. The SSCG 500 includes 200-stage serial connected delay units 511, and each of the delay units 511 includes a latch 512 and an inverter 513 used for changing a delay time. An output terminal Q of the latch 512 controls the delay time of the inverter 513, wherein when an output of the latch 512 is logic 1, the delay time of the inverter 513 is relatively long, and when the output of the latch 512 is logic 0, the delay time of the inverter 513 is relatively short. A multiplexer 521 and an inverter 522 form a control circuit 520, and an output of the control circuit 520 is a signal Q0. The 200 latches 512 of the SSCG 500 are serially connected into a sequence, and the 200 inverters 513 are serially connected into another sequence. During each cycle of an input clock signal Fin, the signal Q0 is shifted to a signal Q200, the signal Q200 is shifted to a signal Q199, and the signal Q199 is shifted to a signal Q198, deduced by analogy, the signal Q2 is shifted to a signal Q1.

At the beginning, the signals $Q_1$ to $Q_{200}$ are all logic 0, the control circuit 520 sets the signal $Q_0$ to be logic 1, and the input clock signal Fin is processed by the 200-stage inverters 513 to form an output clock signal Fout. After the 200 short delays, the output clock signal Fout then has the shortest cycle and the highest frequency. During a next cycle, the rightmost latch 512 latches the signal $Q_0$, and turns the signal $Q_{200}$ into logic 1, so that after the input clock signal Fin is processed by 199 short delays and one long delay, the cycle of output clock signal Fout is slightly prolonged, and the frequency thereof is slightly decreased. During a still next cycle, the second rightmost latch 512 latches the signal $Q_{200}$, and turns the signal $Q_{199}$ into logic 1, so that after the input clock signal Fin is processed by 198 short delays and two long delays, the cycle of output clock signal Fout is further prolonged, and the frequency thereof is further decreased. By such means, as the logic 1 of the signal $Q_0$ passes through the latch sequence stage by stage, the frequency of the output clock signal Fout becomes lower and lower. When the signals $Q_1$ to $Q_{200}$ are all logic 1, the frequency of the output clock signal Fout is the lowest, and now the control circuit 520 sets the signal $Q_0$ to be 0. During each of the next cycles, as the logic 0 passes through the latch sequence stage by stage, the long delays processed to the output clock signal Fin are substituted by the short delays one by one, so that the frequency of the output clock signal Fout is gradually increased. Therefore, as long as the control circuit 520 switches the signal $Q_0$ to be logic 0 or 1 according to a certain rule, the spectrum spreading then can be achieved.

The SSCG 500 is a pure digital design, which does not include the capacitors, so that an area thereof is relatively small, though it still has defects. Due to realistic factors such as fabrication variation, fluctuation of an operation voltage, and temperature variation, etc., charging/discharging capabilities of the inverters 513 are asymmetric, namely, capabilities of the inverters 513 for pulling up and pulling down the output signal are asymmetric. After 200 stages accumulation, when the input clock signal Fin enters a high frequency region, a duty cycle of the output clock signal Fout is dramatically varied. Namely, the output clock signal Fout is seriously deformed, even is saturated to have all high voltages or low voltages (i.e., 100% or 0% duty cycle). In such case, the SSCG 500 fails to function.

SUMMARY OF THE INVENTION

The present invention is directed to an SSCG, which can resolve a capacitor area problem, a looping time problem and a duty cycle problem of a conventional technique.

The present invention provides an SSCG including a modulation module and a voltage-controlled delay line (VCDL). The modulation module provides a control voltage. The VCDL is coupled to the modulation module and is configured for modulating a frequency of an input clock signal according to the control voltage, so as to output an output clock signal, wherein a modulation profile of the output clock signal is a periodic function of time.

In an embodiment of the present invention, the modulation profile of the output clock signal is a sine wave, a triangle wave or a Hershey's Kiss. In an embodiment of the present invention, the modulation module includes a clock generator and a waveform re-shaper. The clock generator provides a modulation clock signal. The waveform re-shaper is coupled between the clock generator and the VCDL for providing the control voltage for the VCDL according to the modulation clock signal.

In an embodiment of the present invention, a frequency of the modulation clock signal is equal to a modulation frequency of the output clock signal. In an embodiment of the present invention, the clock generator is a frequency divider, which is used for dividing a frequency of the input clock signal by a predetermined value to serve as the modulation clock signal.

In an embodiment of the present invention, the clock generator is a ring oscillator, and the modulation clock signal has a fixed frequency.

In an embodiment of the present invention, the waveform re-shaper includes a charge pump, a capacitor, and a filter. The charge pump is coupled to the clock generator. The capacitor is coupled to the charge pump. The filter is coupled between the capacitor and the VCDL. The modulation clock signal controls the charge pump to charge or discharge the capacitor, and the capacitor provides a triangle wave in response to charging or discharging operation of the charge pump. The filter provides a sine wave according to the triangle wave to serve as the control voltage of the VCDL.

In an embodiment of the present invention, the waveform re-shaper includes a read only memory (ROM). The ROM stores a mapping relation of the modulation clock signal and the control voltage. The waveform re-shaper inquires the ROM according to the modulation clock signal, so as to provide the control voltage to the VCDL.

In an embodiment of the present invention, the clock generator is a ring oscillator, and the modulation clock signal has a fixed frequency. The waveform re-shaper determines a frequency of the control voltage according to the modulation clock signal, and determines an amplitude of the control voltage according to the input clock signal, so as to fix a modulation percentage of the output clock signal.

In an embodiment of the present invention, the waveform re-shaper includes a frequency-to-current converter and a switched capacitor filter. The frequency-to-current converter provides a current according to the frequency of the input clock signal. The switched capacitor filter is coupled among the clock generator, the frequency-to-current converter and the VCDL for providing the control voltage to the VCDL according to the current and the modulation clock signal, wherein the current determines the amplitude of the control voltage, and the frequency of the modulation clock signal determines the frequency of the control voltage.

In an embodiment of the present invention, the waveform re-shaper includes a ROM. The ROM stores a mapping relation of the input clock signal, the modulation clock signal and the control voltage. The waveform re-shaper inquires the ROM according to the input clock signal and the modulation clock signal, so as to provide the control voltage to the VCDL.

In an embodiment of the present invention, the control voltage is a periodic function of time, for example a sine wave or a waveform between a square wave and the sine wave.

In an embodiment of the present invention, a maximum slope of the waveform of the control voltage is greater than a maximum slope of a sine wave, and the control voltage and the sine wave have the same amplitude and cycle.

In an embodiment of the present invention, the control voltage is a waveform generated by a predetermined function of a predetermined waveform and the predetermined waveform is a periodic function of time.

In an embodiment of the present invention, the predetermined waveform is a triangle waveform, and the predetermined function is an arctangent function.

In the present invention, the SSCG does not apply the conventional structure, but applies the VCDL. Since bulk capacitors are not included, the circuit area of the SSCG is far less than that of the conventional SSCG, and due to an all-digital design, the looping time is rather short, and only a little part of the signal has the propagation delay. Moreover, since a delay mechanism of multi-stage serial connection is not applied, the duty cycle problem of the conventional technique can be resolved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 6:
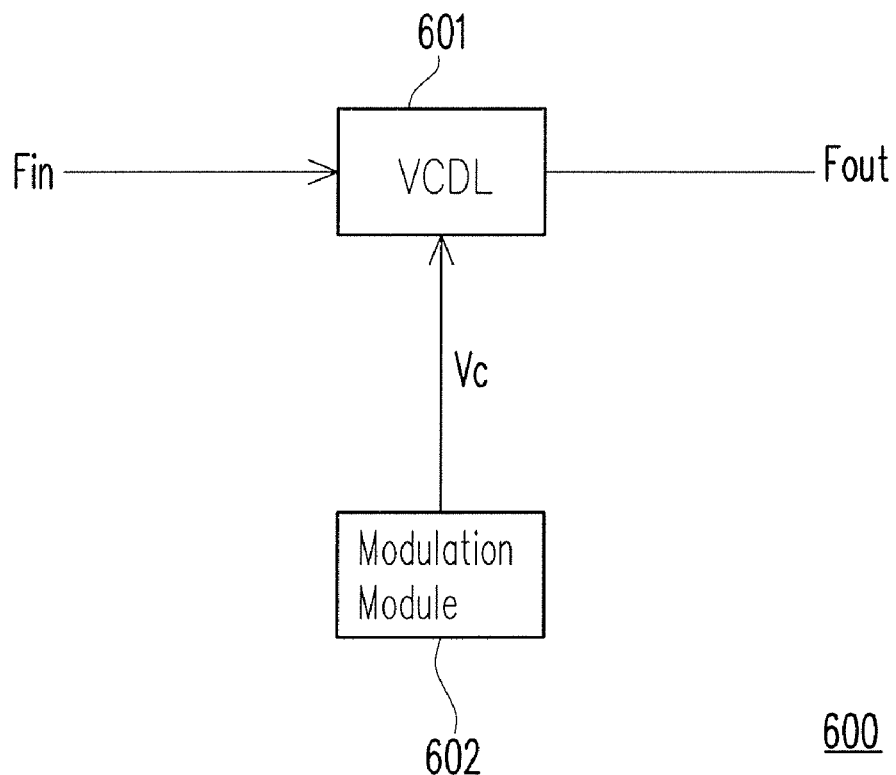
FIGS. 6, 8, 9 and 11 are schematic circuit diagrams of SSCGs according to different embodiments of the present invention.

FIG. 6 is a circuit diagram illustrating an SSCG 600 according to an embodiment of the present invention. The SSCG 600 includes a modulation module 602 and a VCDL 601. The VCDL 601 is coupled to the modulation module 602. The VCDL 601 is a device similar to a voltage control oscillator (VCO), and a delay time thereof can be controlled by an external voltage. An input clock signal Fin is delayed by the VCDL 601 to form an output clock signal Fout, and a control voltage Vc provided by the modulation module 602 controls the delay time of the input clock signal Fin delayed by the VCDL 601.

Figure 1:
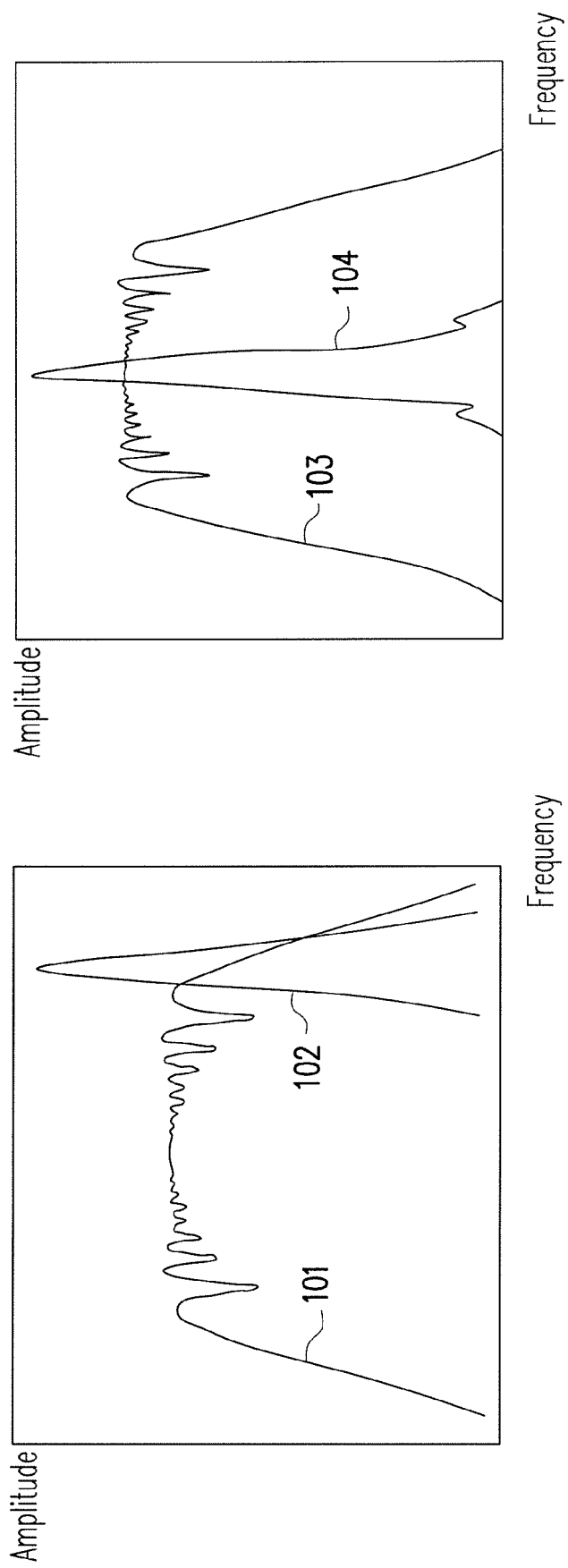
FIG. 1A and FIG. 1B illustrate two conventional spread-spectrum methods.
Figure 2:
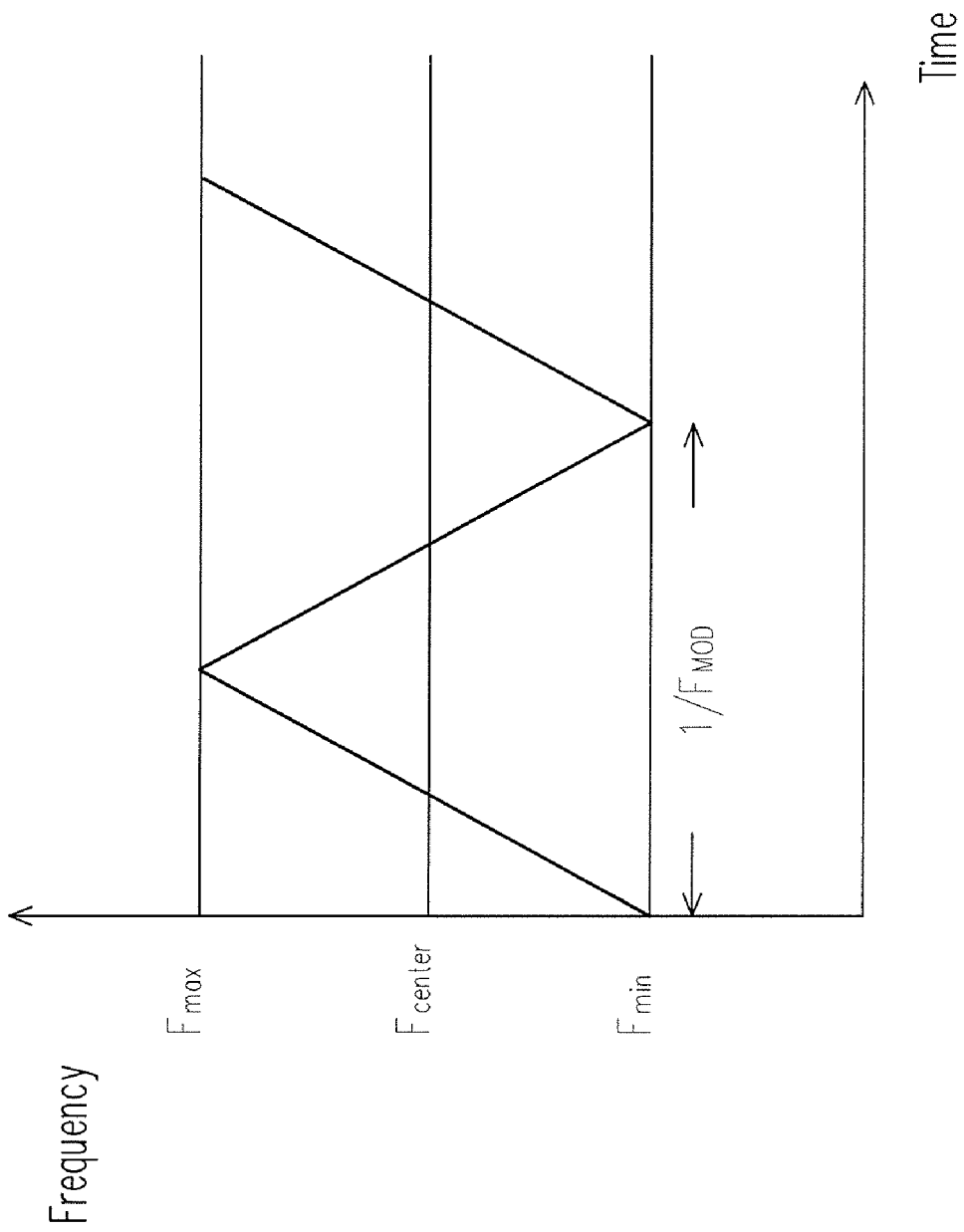
FIG. 2 is a schematic diagram illustrating a typical clock frequency modulation profile.
Figure 3:
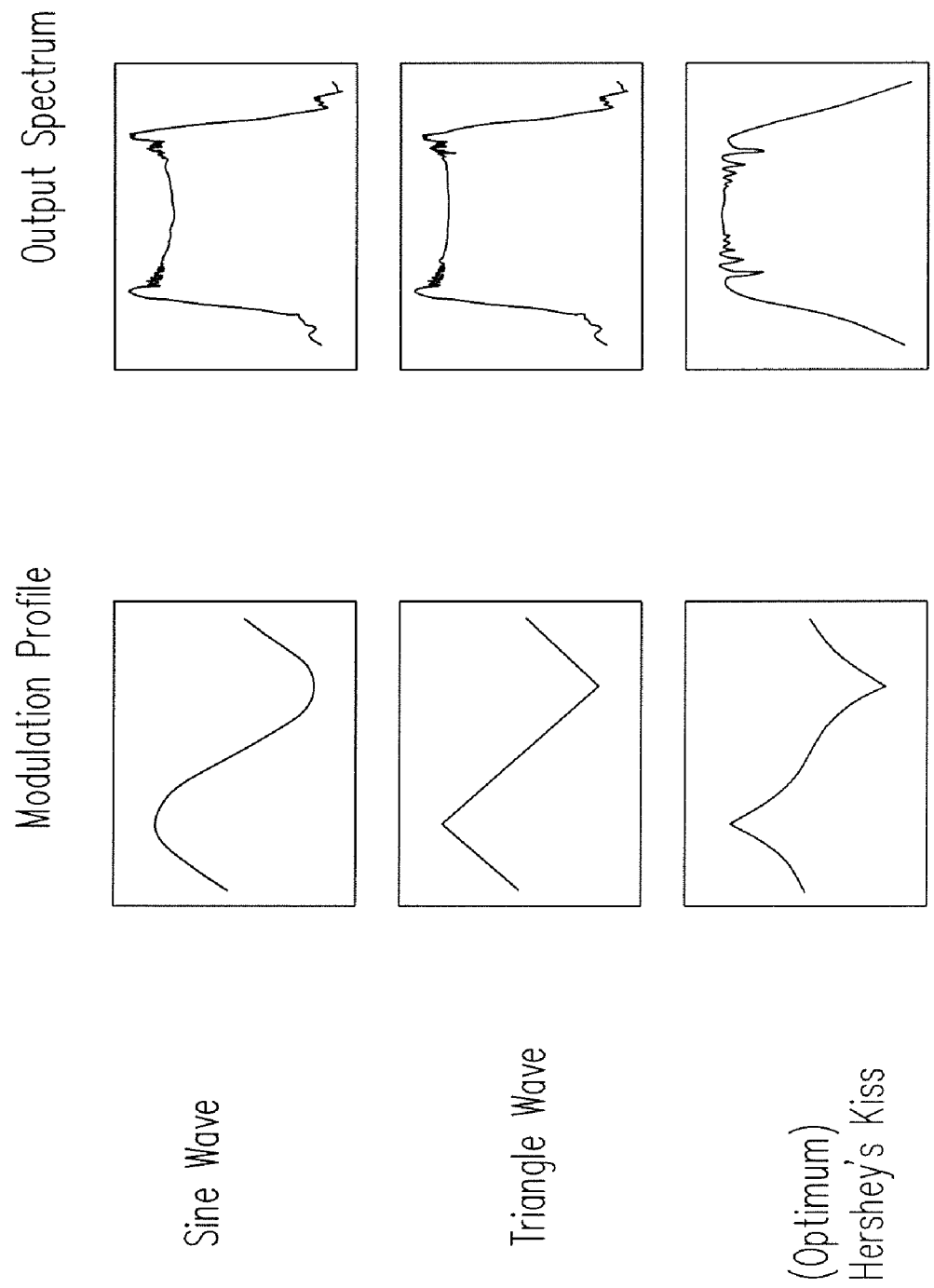
FIG. 3 is a schematic diagram illustrating several conventional clock frequency modulation profiles and corresponding output spectrums.
Figure 4:
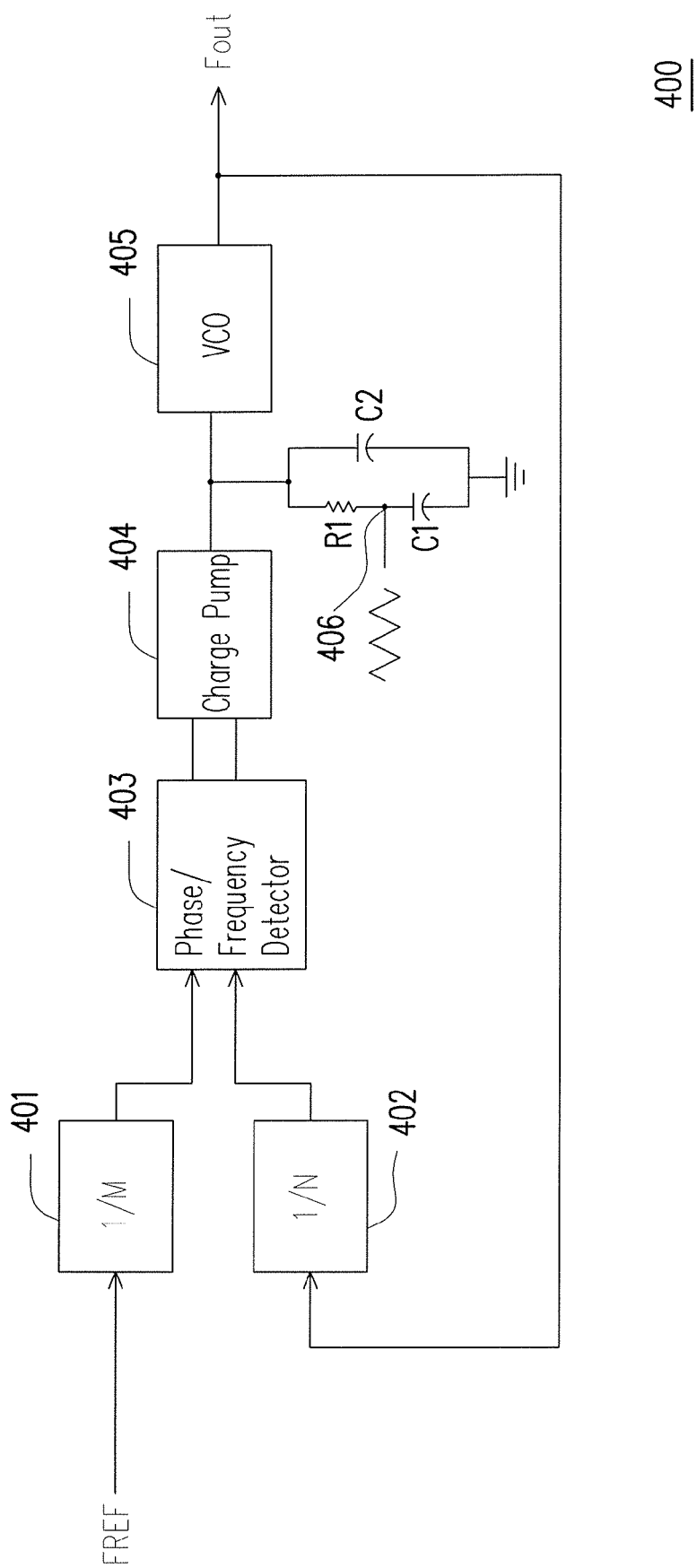
FIG. 4 and FIG. 5 are schematic circuit diagrams illustrating two conventional SSCGs.
Figure 5:
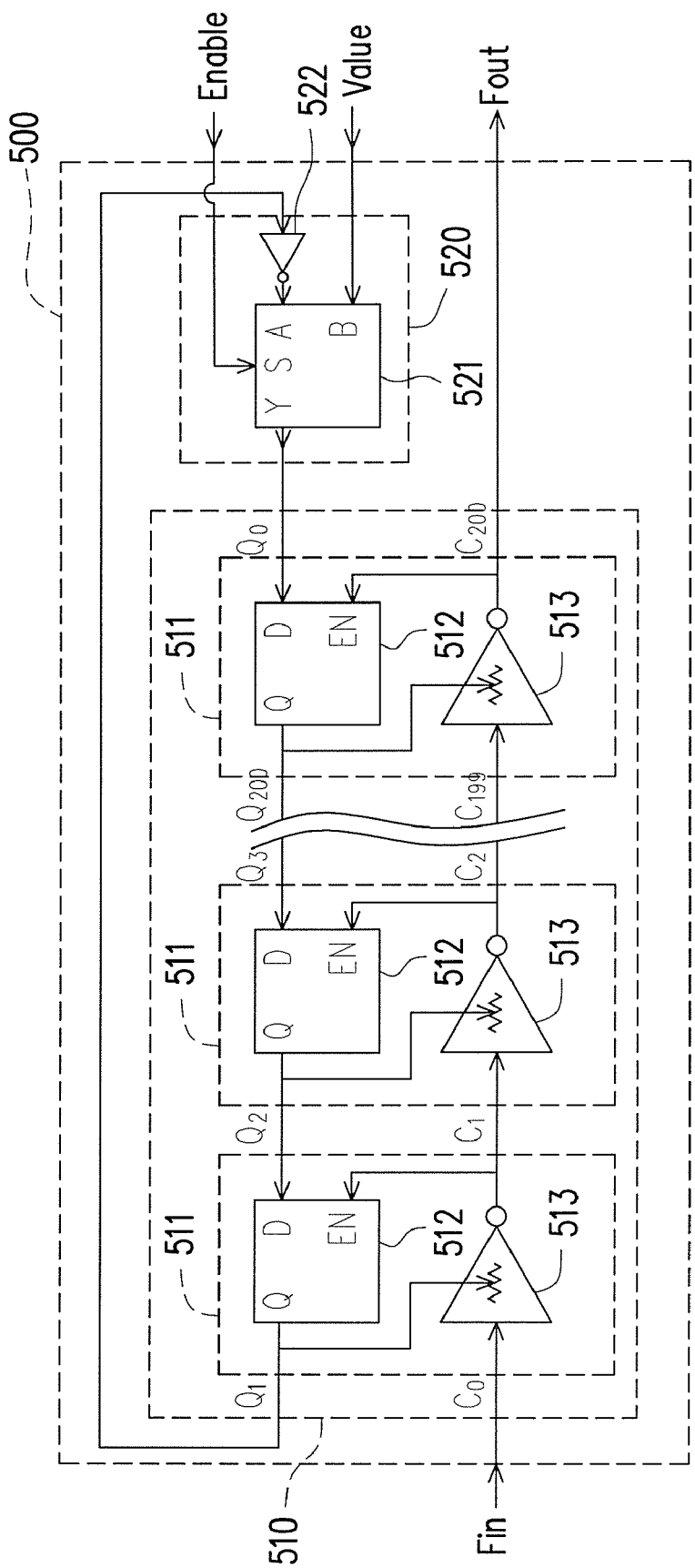

Variation of the delay time is a variation of a clock cycle, and also a variation of a clock frequency. In other words, the VCDL 601 can modulate the frequency of the input clock signal Fin according to the control voltage Vc for providing the output clock signal Fout. One of the emphases of the present invention is to implement the SSCG via the VCDL. Namely, to generate the control voltage Vc, so that the VCDL 601 can generate a suitable delay for assigning the output clock signal various modulation profiles. For practical application, the frequency of the output clock signal Fout has to present smooth and regular up and down variations, for example, a sine wave, a triangle wave, a Hershey's Kiss of FIG. 3, or other periodic modulation profiles.

Figure 7:
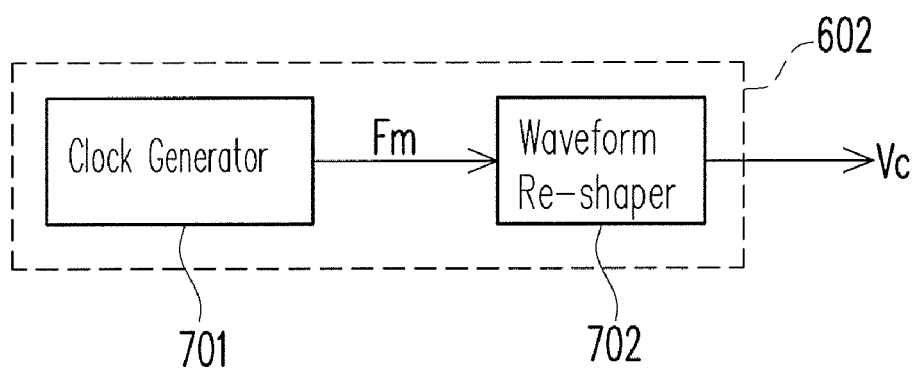
FIG. 7 is a schematic circuit diagram illustrating the modulation module of FIG. 6.

Next, referring to FIG. 7, the modulation module 602 of the present embodiment includes a clock generator 701 and a waveform re-shaper 702. The waveform re-shaper 702 is coupled between the clock generator 701 and the VCDL 601. The clock generator 701 provides a modulation clock signal Fm, and a frequency of the modulation clock signal Fm is equal to a modulation frequency of the output clock signal Fout. Since a square wave of the modulation clock signal Fm only has two voltages (high level and low level), it may not be suitable for spectrum spreading. Therefore, the waveform re-shaper 702 is adopted for converting the modulation clock signal Fm into the control voltage Vc which is suitable for the spectrum spreading.

Figure 8:
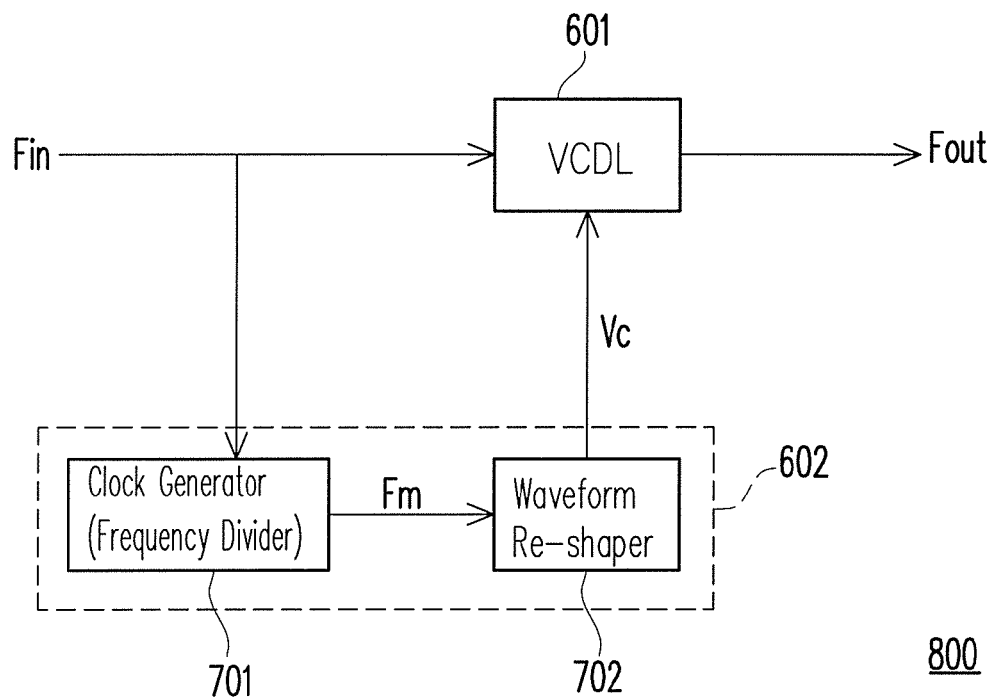

The modulation module 602 has three implementing approaches, and one of which is shown in a circuit diagram of FIG. 8. In the SSCG 800 of FIG. 8, the clock generator 701 is implemented by a frequency divider. The frequency divider divides the frequency of the input clock signal Fin by a predetermined value to obtain the modulation clock signal Fm. For example, if the frequency of the input clock signal Fin is 10 MHz, and a target modulation frequency is 10 kHz, the predetermined value for the frequency dividing is then 1000.

In the SSCG 800 of FIG. 8, a ratio between the frequency of the input clock signal Fin and the modulation frequency of the output clock signal Fout is fixed. Namely, the modulation frequency is varied according to the frequency of the input clock signal Fin. If a fixed modulation frequency is required, a second implementing method of the modulation module 602 shown as FIG. 9 can be applied. In the SSCG 900 of FIG. 9, the clock generator 701 is implemented by a ring oscillator. The modulation clock signal Fm provided by the ring oscillator has a fixed frequency, which is unrelated to the input clock signal Fin. Therefore, the modulation frequency of the output clock signal Fout can be fixed (i.e., the modulation frequency can be independent of the input clock signal Fin).

Figure 9:
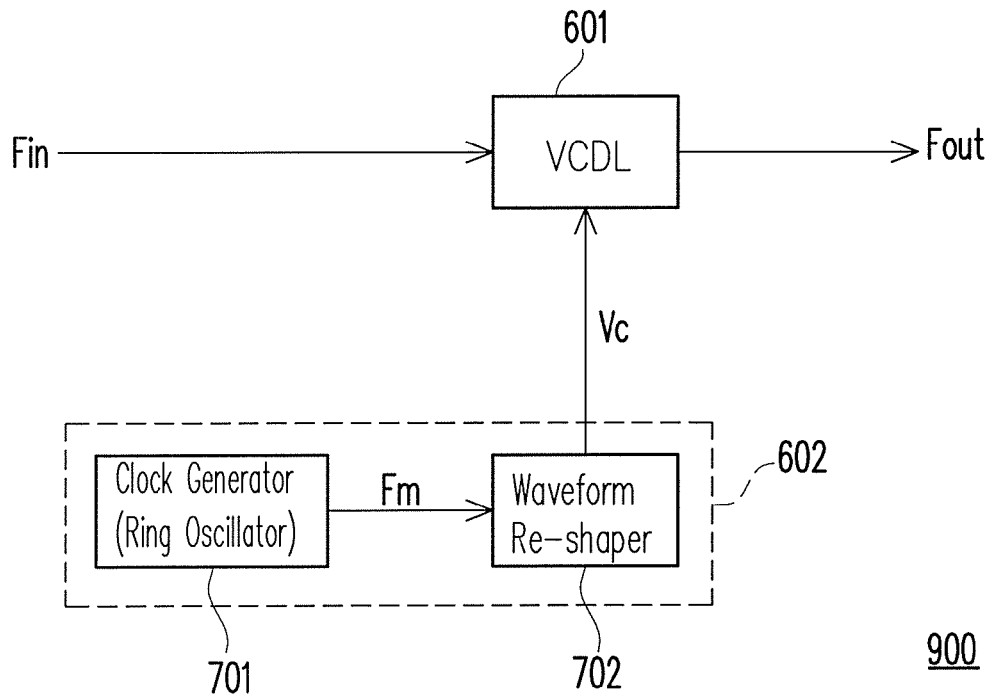
Figure 10:
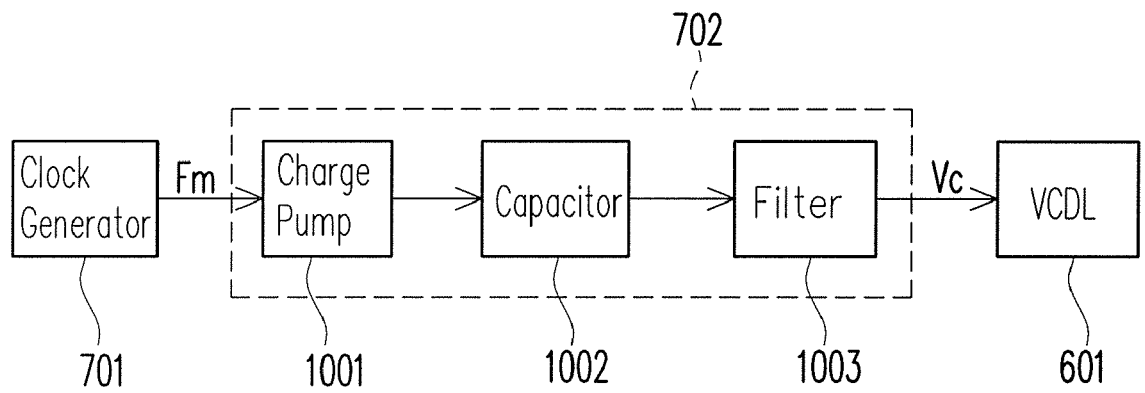
FIG. 10 is a schematic circuit diagram illustrating the waveform re-shaper of FIG. 8 and FIG. 9.

The waveform re-shaper 702 of FIG. 8 and FIG. 9 can be implemented via an analog approach shown as FIG. 10. In FIG. 10, the waveform re-shaper 702 includes a charge pump 1001, a capacitor 1002 and a filter 1003. The charge pump 1001 is coupled to the clock generator 701, the capacitor 1002 is coupled to the charge pump 1001, and the filter 1003 is coupled between the capacitor 1002 and the VCDL 601. The modulation clock signal Fm controls the charge pump 1001 to charge or discharge the capacitor 1002, and the capacitor 1002 provides a triangle wave in response to the charging or discharging operation of the charge pump 1001. The triangle wave is processed by the filter 1003 to form a sine wave to serve as the control voltage Vc. The sine wave control voltage Vc is used for modulating the VCDL 601 to obtain a sine wave modulation profile.

Besides the analog approach shown as FIG. 10, the waveform re-shaper 702 of FIG. 8 and FIG. 9 can also be implemented by a digital approach. In such digital approach, the waveform re-shaper 702 stores a mapping relation of the modulation clock signal Fm and the control voltage Vc via an embedded ROM, and inquires the ROM according to the modulation clock signal Fm for providing the corresponding control voltage Vc.

Figure 11:
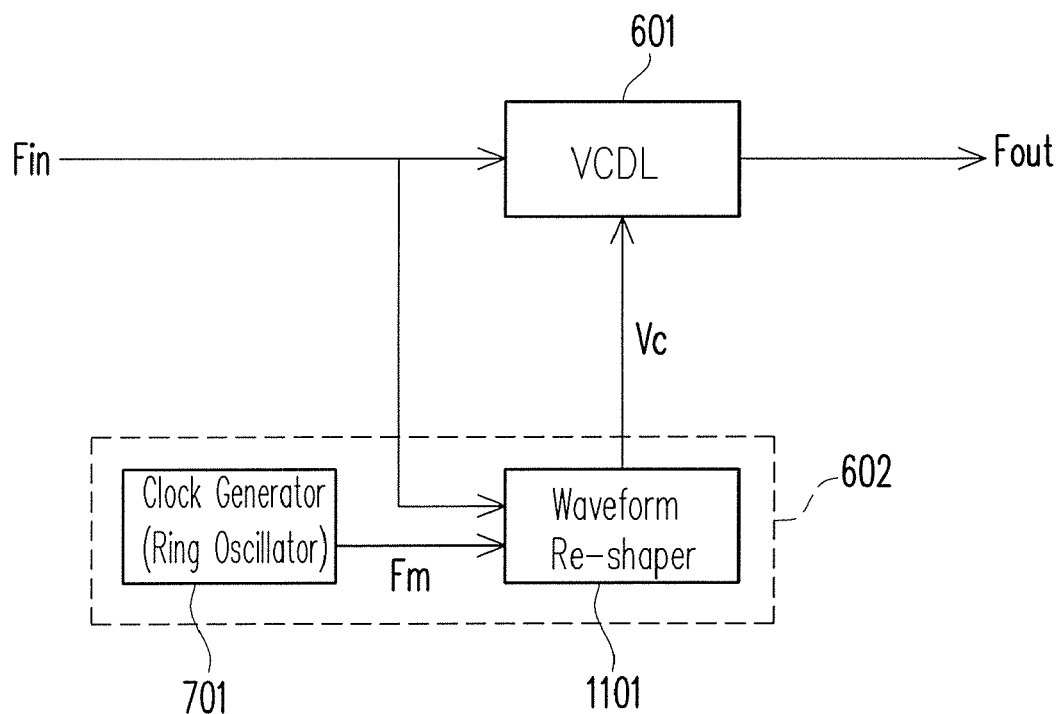

As described above, the modulation module 602 of the present embodiment has three implementing approaches, and for the implementing approach shown as FIG. 8 and FIG. 9, amplitude of the control voltage Vc output from the waveform re-shaper 702 is fixed. Namely, variation amount of the frequency of the output clock signal Fout is fixed. When the frequency of the input clock signal Fin is varied, the modulation percentage thereof is varied accordingly. If the fixed modulation frequency and the modulation percentage are required, a third implementing approach shown as FIG. 11 can be applied. In the SSCG 1100 of FIG. 11, the waveform re-shaper 702 is substituted by a waveform re-shaper 1101. The modulation clock signal Fm provided by the ring oscillator 701 has a fixed frequency, and the waveform re-shaper 1101 provides the control voltage Vc. Different from the above two implementing approaches, the waveform re-shaper 1101 determines the frequency of the control voltage Vc according to the frequency of the modulation clock signal Fm, and determines the amplitude of the control voltage Vc according to the frequency of the input clock signal Fin. The waveform re-shaper 1101 maintains a fixed proportion relation between the frequency of the control voltage Vc and the frequency of the modulation clock signal Fm, wherein the frequency of the modulation clock signal Fm is a fixed value, so that the frequency of the control voltage Vc is also a fixed value. Therefore, the modulation frequency of the output clock signal Fout can be fixed. Moreover, the waveform re-shaper 1101 can dynamically adjust the amplitude of the control voltage Vc according to the frequency of the input clock signal Fin, so as to fix the modulation percentage of the output clock signal Fout.

Figure 12:
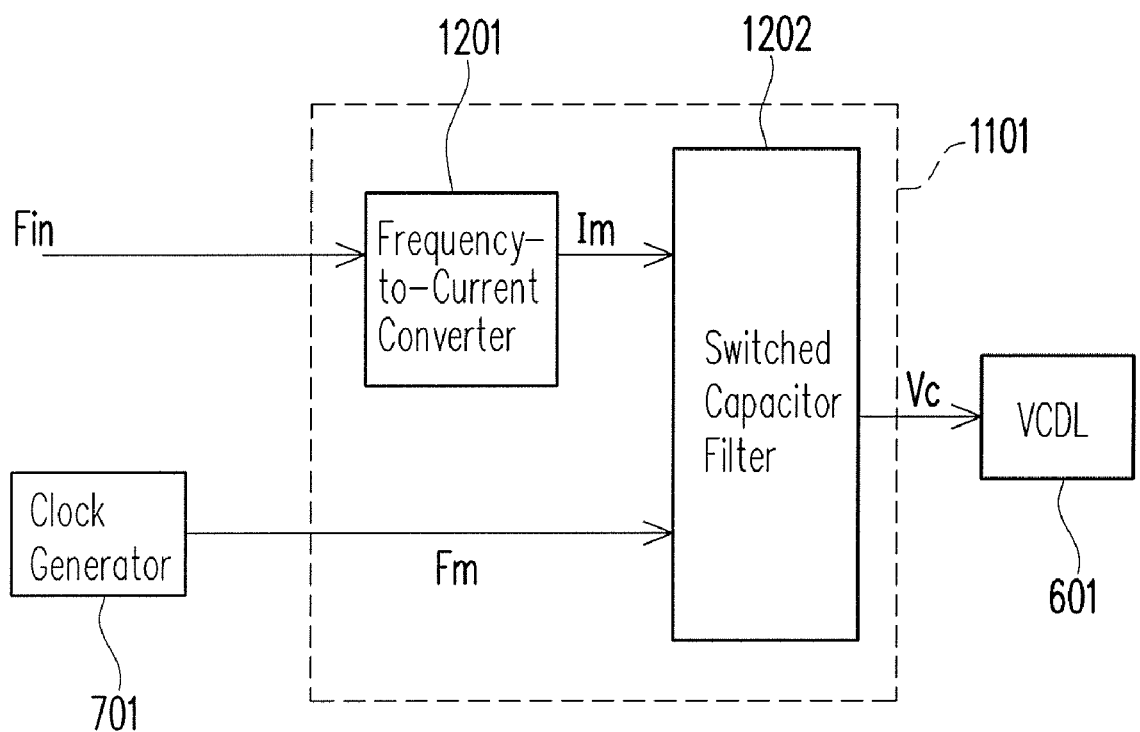
FIG. 12 is a schematic circuit diagram illustrating the waveform re-shaper of FIG. 11.

The waveform re-shaper 1101 can be implemented via an analog approach shown as FIG. 12. In FIG. 12, the waveform re-shaper 1101 includes a frequency-to-current converter 1201 and a switched capacitor filter 1202. The switched capacitor filter 1202 is coupled among the clock generator 701, the frequency-to-current converter 1201 and the VCDL 601. The frequency-to-current converter 1201 provides a current Im according to the frequency of the input clock signal Fin. The switched capacitor filter 1202 filters the modulation clock signal Fm by switching capacitors, and the obtained signal is the control voltage Vc. The frequency of the control voltage Vc is equal to the frequency of the modulation clock signal Fm, so that the modulation frequency can be fixed. The frequency of the input clock signal Fin controls the current Im, and the current Im controls the amplitude of the control voltage Vc, so that the modulation percentage can be fixed.

Besides the analog approach shown as FIG. 12, the waveform re-shaper 1101 can also be implemented by the digital approach. In such digital approach, the waveform re-shaper 1101 stores a mapping relation of the input clock signal Fin, the modulation clock signal Fm and the control voltage Vc via an embedded ROM, and inquires the ROM according to the input clock signal Fin and the modulation clock signal Fm for providing the corresponding control voltage Vc.

Figure 13:
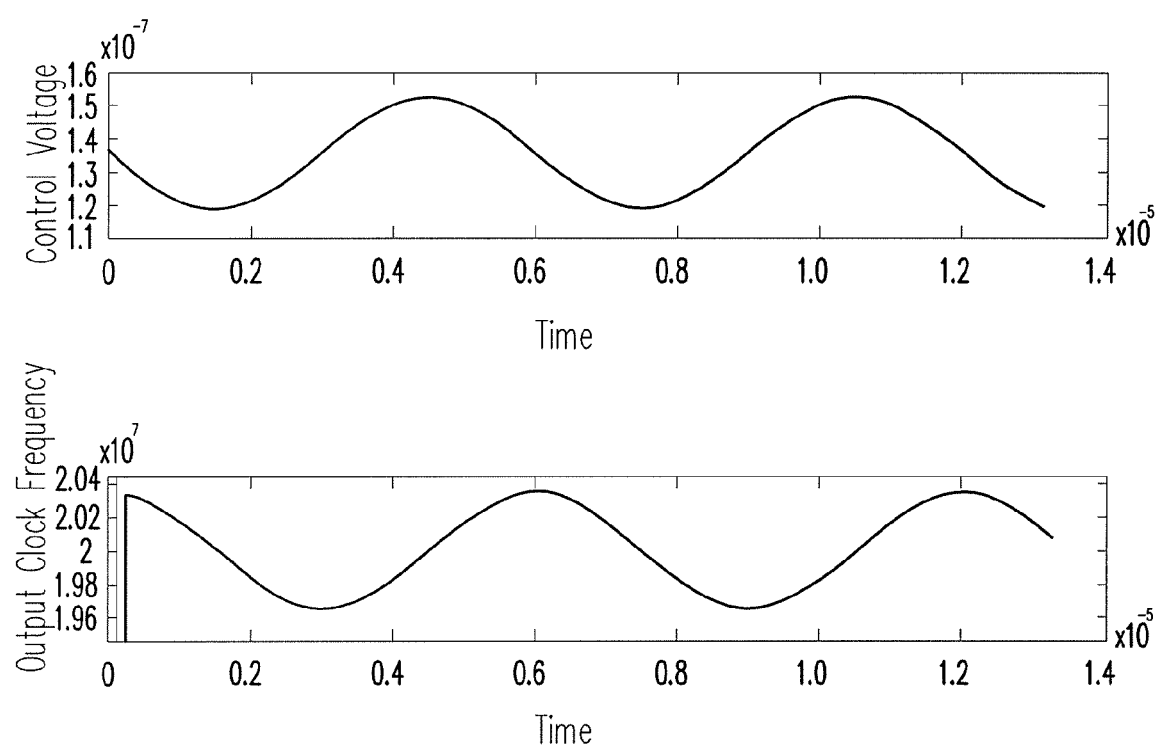
FIG. 13 and FIG. 14 are computer simulation results according to an embodiment of the present invention.

FIG. 13 is a computer simulation of a waveform of the control voltage Vc and a waveform of the frequency of the output clock signal Fout according to an embodiment of the present invention, in which an essence thereof is a relation between the control voltage Vc and the frequency of the output clock signal Fout. As shown in FIG. 13, the control voltage Vc is a periodic sine wave, and the frequency variation of the Fout is also a periodic sine wave.

Figure 14:
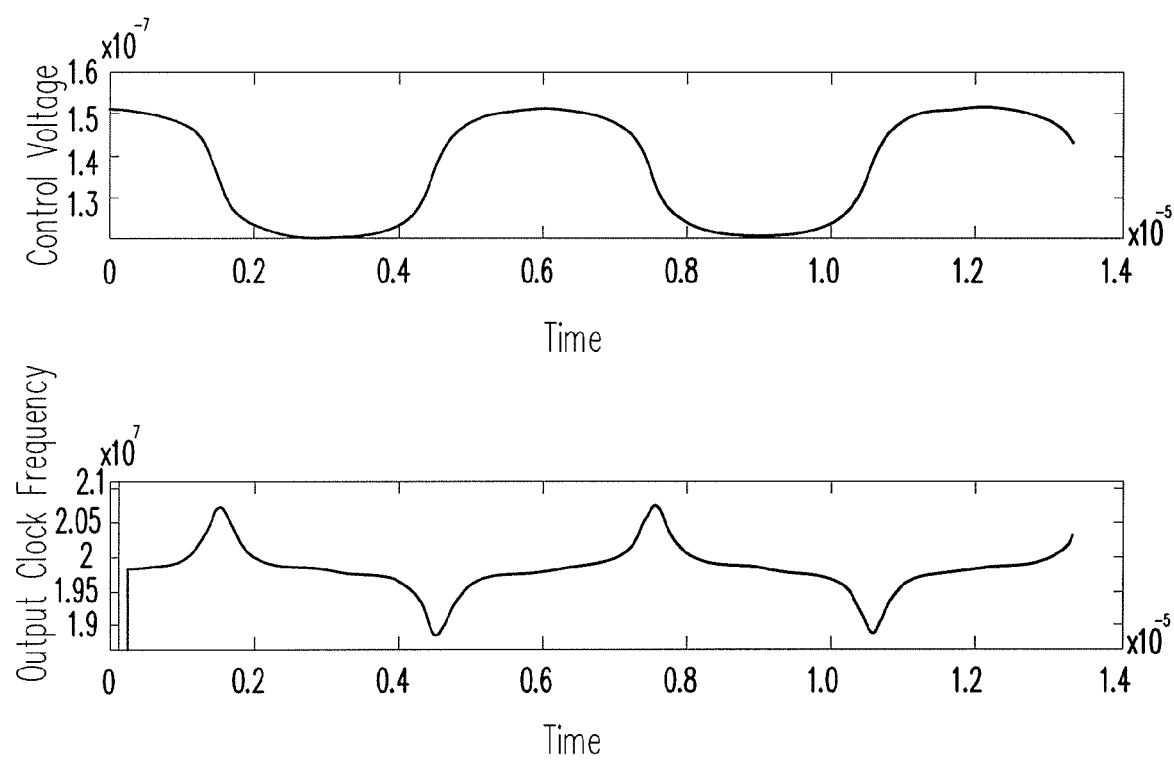

FIG. 14 is a computer simulation of a waveform of the control voltage Vc and a waveform of the frequency of the output clock signal Fout according to another embodiment of the present invention, in which an essence thereof is also a relation between the control voltage Vc and the frequency of the output clock signal Fout. The simulation of FIG. 14 is to achieve a greater modulation percentage than that of the simulation of FIG. 13. A characteristic of the VCDL is that the greater a transient slope of the control voltage Vc is, the greater the modulation percentage of the output clock thereof is. Therefore, when the control voltage Vc is varied between a maximum value and a minimum value, variation of the slopes has to be more dramatic, so as to present a larger slope. Comparatively, variation of the slopes of the control voltage Vc around the maximum value and the minimum value has to be moderate. The waveform of the control voltage matching such requirement is shown as FIG. 14, and such waveform is generated by inputting a periodic triangle wave to an arctangent function, and the waveform thereof is between a square wave and a sine wave. Compared to the sine wave having the same amplitude and the same cycle, the maximum slope of the waveform of the control voltage of FIG. 14 is greater than the maximum slope of the sine wave. In the simulation of FIG. 13, the maximum output clock frequency is 20.3 MHz, and the modulation percentage is ±1.5%. The waveform of the control voltage of FIG. 14 increases the maximum output clock frequency to 20.8 MHz, and increases the modulation percentage to 4%. The waveform of the control voltage of FIG. 14 not only increases the modulation percentage, but can also obtain the modulation profile closed to the Hershey's Kiss, so that the output spectrum can be more closed to the optimal spectrum.

The waveform of the control voltage of FIG. 13 and FIG. 14 can be generated by an actual circuit. For example, the ROM can be embedded into any of the aforementioned waveform re-shapers for storing a waveform mapping table of the control voltage Vc. By such means, the waveform re-shaper can inquire the waveform mapping table according to the input signal, so as to output the corresponding control voltage Vc. Based on such digital approach, besides the waveforms of FIG. 13 and FIG. 14, the waveform re-shaper can further provide other types of the waveform of the control voltage. For example, a periodic waveform generated by passing a predetermined periodic function of time through another predetermined function. As long as the generated periodic waveform is smoothly and continuously varied, it can be used for modulating the VCDL, so as to achieve the spread spectrum function.

In summary, the SSCG provided by the present invention does not apply a conventional PLL structure and a serial delay structure, but applies a more simple design, so that the circuit area thereof can be smaller than that of the conventional circuit, and the problem of the capacitor area and the duty cycle problem of the conventional technique can be resolved. Moreover, only a simple VCDL is applied between the input signal and the output signal of the SSCG, so that only a little part of the signal has the propagation delay, and compared to the conventional circuit, looping time thereof is rather short.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A spread-spectrum clock generator (SSCG), comprising:
a modulation module, for providing a control voltage; and
a voltage-controlled delay line (VCDL), coupled to the modulation module, for modulating a frequency of an input clock signal according to the control voltage, so as to provide an output clock signal, wherein a modulation profile of the output clock signal is a periodic function and the modulation module comprises:
a clock generator, for providing a modulation clock signal; and
a waveform re-shaper, coupled between the clock generator and the VCDL for providing the control voltage according to the modulation clock signal.

2. The SSCG as claimed in claim 1, wherein a frequency of the modulation clock signal is equal to a modulation frequency of the output clock signal.

3. The SSCG as claimed in claim 2, wherein the clock generator is a frequency divider used for dividing a frequency of the input clock signal by a predetermined value to serve as the modulation clock signal.

4. The SSCG as claimed in claim 2, wherein the clock generator is a ring oscillator and the modulation clock signal has a fixed frequency.

5. The SSCG as claimed in claim 2, wherein the waveform re-shaper comprises:
a charge pump, coupled to the clock generator;
a capacitor, coupled to the charge pump; and
a filter, coupled between the capacitor and the VCDL,
wherein the modulation clock signal controls the charge pump to charge or discharge the capacitor, the capacitor provides a triangle wave in response to the charging or discharging operation of the charge pump, and the filter provides a sine wave according to the triangle wave to serve as the control voltage.

6. The SSCG as claimed in claim 2, wherein the waveform re-shaper comprises a read only memory (ROM), the ROM stores a mapping relation of the modulation clock signal and the control voltage, and the waveform re-shaper inquires the ROM according to the modulation clock signal for providing the control voltage.

7. The SSCG as claimed in claim 2, wherein the clock generator is a ring oscillator, the modulation clock signal has a fixed frequency, and the waveform re-shaper determines a frequency of the control voltage according to the modulation clock signal, and determines an amplitude of the control voltage according to the input clock signal, so as to fix a modulation percentage of the output clock signal.

8. The SSCG as claimed in claim 7, wherein the waveform re-shaper comprises:
a frequency-to-current converter, for providing a current according to the frequency of the input clock signal; and
a switched capacitor filter, coupled among the clock generator, the frequency-to-current converter and the VCDL for providing the control voltage according to the current and the modulation clock signal, wherein the current determines the amplitude of the control voltage, and the frequency of the modulation clock signal determines the frequency of the control voltage.

9. The SSCG as claimed in claim 7, wherein the waveform re-shaper comprises a ROM, the ROM stores a mapping relation of the input clock signal, the modulation clock signal and the control voltage, and the waveform re-shaper inquires the ROM according to the input clock signal and the modulation clock signal, so as to provide the control voltage.

10. A spread-spectrum clock generator (SSCG), comprising:
 a modulation module, for providing a control voltage, wherein the control voltage is a periodic function of time, a maximum slope of the waveform of the control voltage is greater than a maximum slope of a sine wave, and the control voltage and the sine wave have the same amplitude and cycle; and
 a voltage-controlled delay line (VCDL), coupled to the modulation module, for modulating a frequency of an input clock signal according to the control voltage, so as to provide an output clock signal, wherein a modulation profile of the output clock signal is a periodic function.

11. A spread-spectrum clock generator (SSCG), comprising:
 a modulation module, for providing a control voltage, wherein the control voltage is a waveform generated by an arctangent function of a triangle waveform, and the triangle waveform is a periodic function of time; and
 a voltage-controlled delay line (VCDL), coupled to the modulation module, for modulating a frequency of an input clock signal according to the control voltage, so as to provide an output clock signal, wherein a modulation profile of the output clock signal is a periodic function.

\* \* \* \* \*